(12) United States Patent
Heegard et al.

(10) Patent No.: US 6,701,483 B1
(45) Date of Patent: Mar. 2, 2004

(54) FAST SEARCH-BASED DECODING SCHEME

(75) Inventors: Chris Heegard, Santa Rosa, CA (US); Matthew B. Shoemake, Allen, TX (US); Scott Petler, Sebastopol, CA (US)

(73) Assignee: Alantro Communications, Inc., Santa Rosa, CA (US)

( * ) Notice: Subject to any disclaimer, the term of this patent is extended or adjusted under 35 U.S.C. 154(b) by 719 days.

(21) Appl. No.: 09/642,266

(22) Filed: Aug. 18, 2000

(51) Int. Cl.$^7$ ............................................. H03M 13/03
(52) U.S. Cl. ........................................ 714/791; 714/792
(58) Field of Search ................................. 375/341, 343; 707/6; 714/791, 796, 792, 794

(56) References Cited

U.S. PATENT DOCUMENTS

| | | | | |
|---|---|---|---|---|
| 6,088,405 A | * | 7/2000 | Hladik et al. | 375/341 |
| 6,205,444 B1 | * | 3/2001 | Floratos et al. | 707/6 |
| 6,343,105 B1 | * | 1/2002 | Saegusa | 375/341 |
| 6,484,285 B1 | * | 11/2002 | Dent | 714/791 |
| 6,510,538 B1 | * | 1/2003 | Jakobsen | 714/796 |

OTHER PUBLICATIONS

Wozencraft, John M. et al., "Principles of Communication Engineering", John Wiley & Sons, Inc., 1965, pp. 425–439.
Lin, Shu et al., "Error Control Coding: Fundamentals and Applications", Prentice–Hall, Inc., 1983, pp. 350–365.
www:http://jungfrau. usc.edu/ee577b/fano.html, "Class Project: The Fano Algorithm, An Introduction."

* cited by examiner

*Primary Examiner*—David Ton
(74) *Attorney, Agent, or Firm*—W. James Brady, III; Frederick J. Telecky, Jr.

(57) ABSTRACT

A method and apparatus for performing a fast search in a search-based decoding algorithm. In one embodiment, the Fano sequential decoding algorithm is used in combination with a fast search-based decoding scheme to reduce the latency inherent in the decoding algorithm. The fast search-based decoding scheme provides a method for estimating metrics ahead of time for edges at distance d at least equal to 2. This allows a decision module such as a Fano state machine to readily make a decision as to which direction and edge to proceed on without further metrics calculation.

15 Claims, 4 Drawing Sheets

FAST SEARCH-BASED DECODING SCHEME

BACKGROUND OF THE INVENTION

The present invention relates to the decoding of digital signals, and more particularly to a search-based decoding scheme that can be used, for example, in connection with a communication system to decode symbols received over a noisy communication channel.

There are many sequential search algorithms that search through graphs (such as, for example, trellises) using various criteria to determine whether to proceed forward or backward through the graph and likewise which edges to take.

Some of the commonly known algorithms of this type are the minimum distance search algorithm well known in the art and the Fano decoding algorithm. The Fano algorithm is described, for example, in J. M. Wozencraft and I. M. Jacobs, *Principles of Communications Engineering*, section 6.4 and in S. Lin and D. J. Costello, Jr., *Error Control Coding: Fundamentals and Applications*, section 12.2.

The minimum distance search algorithm calculates the minimum distance between two vertices in the graph based on the weighting function. If the two vertices represent two towns, the edges represent highways between all towns, and a function is defined on each edge that corresponds to the distance between the two towns represented by the two vertices associated with the edge, then the minimum distance search algorithm finds the shortest possible way to travel between the two towns.

In the Fano algorithm, a sequential decoder searches through a trellis in a path that best matches a received sequence of symbols. An advantage of the Fano algorithm is its independence to the number of states of the trellis. However, the execution time of such algorithm may be very lengthy under a noisy environment, making the use of the Fano algorithm impractical for delay-sensitive applications.

It is desirable to estimate the most likely path through the trellis as fast and accurately as possible, since the most likely path can be used directly to estimate the message that was transmitted through the communications channel. In general, for the Fano Algorithm, the faster the trellis can be searched, the more reliable the estimate can be. Additionally, the faster the trellis can be searched, the faster data may be transmitted through the communications channel, which results in a higher data transmission rate for the communications system.

For the foregoing reasons, there is a need for a method and apparatus for providing an improvement to search-based decoding algorithms. In particular there is a need for reducing the latency inherent to the search-based decoding algorithms including the Fano algorithm.

SUMMARY OF THE INVENTION

The present invention encompasses the use of a search-based decoding algorithm in combination with a fast search-based decoding scheme to reduce the latency inherent with such algorithm. In accordance with the principles of the present invention, distance functions needed in the determination of which edge to follow from one vertex to another vertex at a next stage are pre-computed. This allows the algorithm to proceed at a rate equal to the amount of time it takes to perform said determination.

A method in accordance with one embodiment of the present invention comprises the steps of: (1) computing input values to distance functions associated with a set of edges wherein the edges are at a distance d at least equal to 2 from a current vertex; (2) evaluating the distance functions associated with the edges at distance d=1; and (3) determining an edge to follow from the current vertex to a next vertex, based upon said evaluated distances. The method according this embodiment may be used in conjunction with the Fano algorithm.

In another embodiment, a method for performing a fast search-based decoding in a graph defined by a plurality of vertices and edges is disclosed. The method comprises the steps of: (1) computing input values to distance functions associated with a set of edges wherein the edges are at a distance d at least equal to 2 from a present vertex; (2) obtaining the distance functions associated with the edges at distance d=1; and (3) determining an edge to follow from the current vertex to a next vertex based upon said obtained distance functions. The method may further comprise the step of evaluating distance functions associated with the edges at distance d−2 from the current vertex and wherein the evaluated distance functions are used in a next stage to determine which edge to follow from said next vertex.

In yet another embodiment, the fast search based decoding is used in conjunction with the Fano algorithm.

These and other features and objects of the invention will be more fully understood from the following detailed description of the preferred embodiments which should be read in light of the accompanying drawings.

BRIEF DESCRIPTION OF THE DRAWINGS

The accompanying drawings, which are incorporated in and form a part of the specification, illustrate the embodiments of the present invention and, together with the description serve to explain the principles of the invention.

In the drawings.

DETAILED DESCRIPTION OF THE INVENTION

Figure 1:
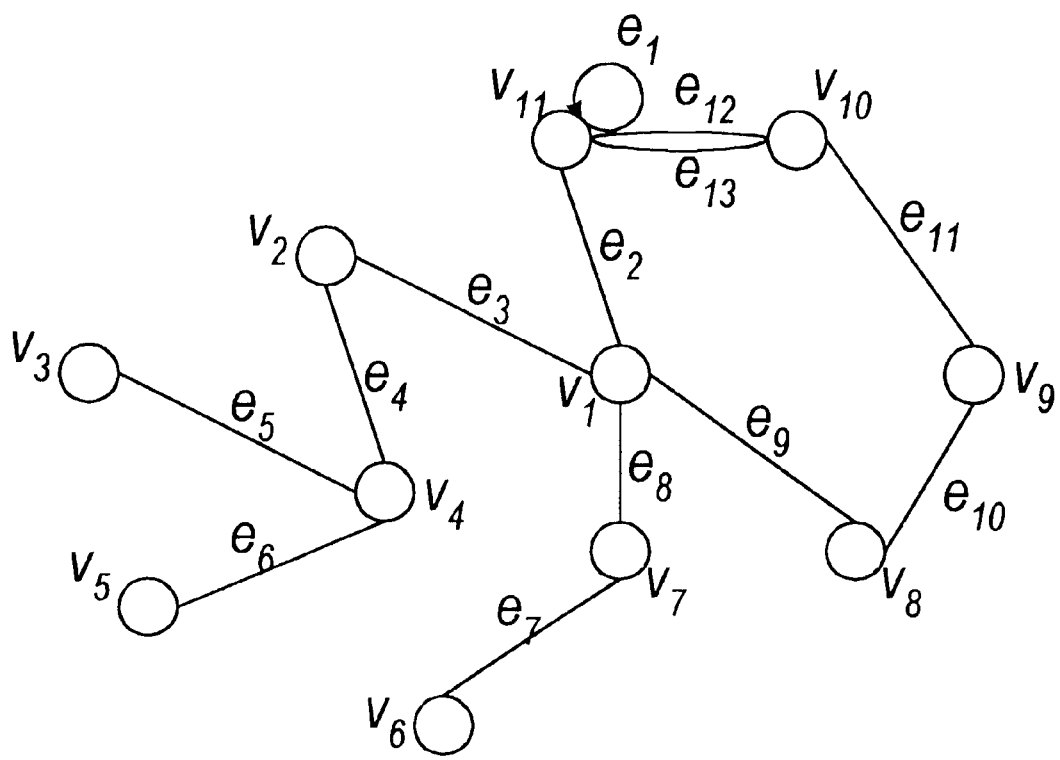
FIG. 1 is an example graph structure used in describing the invention.

In describing a preferred embodiment of the invention illustrated in the drawings, specific terminology will be used for the sake of clarity. However, the invention is not intended to be limited to the specific terms so selected, and it is to be understood that each specific term includes all technical equivalents which operate in a similar manner to accomplish a similar purpose.

With reference to the drawings in general and FIGS. 1 through 5 in particular, the apparatus of the present invention is disclosed.

FIG. 1 shows a graph structure which can be defined by its set of nodes or "vertices", $V=\{V_1, \ldots V_{11}\}$, and its set of branches or "edges", $E=\{e_1, \ldots e_{13}\}$. Each edge connects two vertices in the set V. An edge may be specified as a pair $(V_i, V_k)$, where the edge connects vertices $V_i$ and $V_k$ in V. Associated with any vertex $V_i$ in the graph is a set of connected edges. This set of edges may be thought of as the set of edges that may be reached by starting at vertex $V_i$ and following a valid sequence of one edge from $V_i$. Likewise, there is a set of edges which may be defined as the set of edges that may be reached by starting at vertex $V_i$ and following a valid sequence of two edges from $V_i$. The set $E_{v_1}^n$ shall refer to the set of edges that may be reached by starting at vertex $V_i$ and following a valid sequence of n edges. Edges in this set will be defined herein as edges at distance d=n from vertex $V_i$.

In FIG. 1, vertex $V_1$ has four edges attached to it. This means that $E_{v_1}^1 = \{e_2, e_3, e_8, e_9\}$. If we consider all of the edges that are two steps away from $V_1$, the set $E_{v_1}^2 = \{e_1, e_4, e_7, e_{10}, e_{12}, e_{13}\}$ is obtained. Note that self loops and parallel edges are included. The invention described herein applies to the most general of graphs, including those with self-loops, parallel edges, and cycles.

Algorithms that search through graphs typically make their decisions as to how to proceed through the graph based on some weighting or measure on each edge. For example, a metric function f: E→R associates a real valued measure with each edge in the graph. The metric function may be based on a distance metric or on a correlation metric.

When searching through a graph, it is typical for the processing at each vertex, current vertex $V_c$, and at each stage of the search procedure to consist of performing the three following steps:

(A) obtaining or computing values that are the inputs to the distance or weight function for all edges in $E_{v_c}^1$;

(B) evaluating the distance or weight function for all edges (or a subset of the edges) in $E_{v_c}^1$; and (C) determining which edge to follow from the current vertex, $V_c$, to the next vertex based upon the values calculated in step (B).

The rate at which the algorithm may proceed through the graph is a function of the amount of time that it takes to perform steps (A), (B) and (C) in sequence. Let $T_A$ be the time (in seconds) that it takes to perform step (A), $T_B$ be the time (in seconds) that it takes to perform step (B), and let $T_C$ be the time (in seconds) that it takes to perform step (C). Then, the search algorithm may process each vertex in $(T_A+T_B+T_C)$ seconds. The invention described herein allows searching of the graph at rates faster than $T_A+T_B+T_C$ seconds per vertex, without reduction of $T_A$ or $T_B$ or $T_C$.

Figure 2:
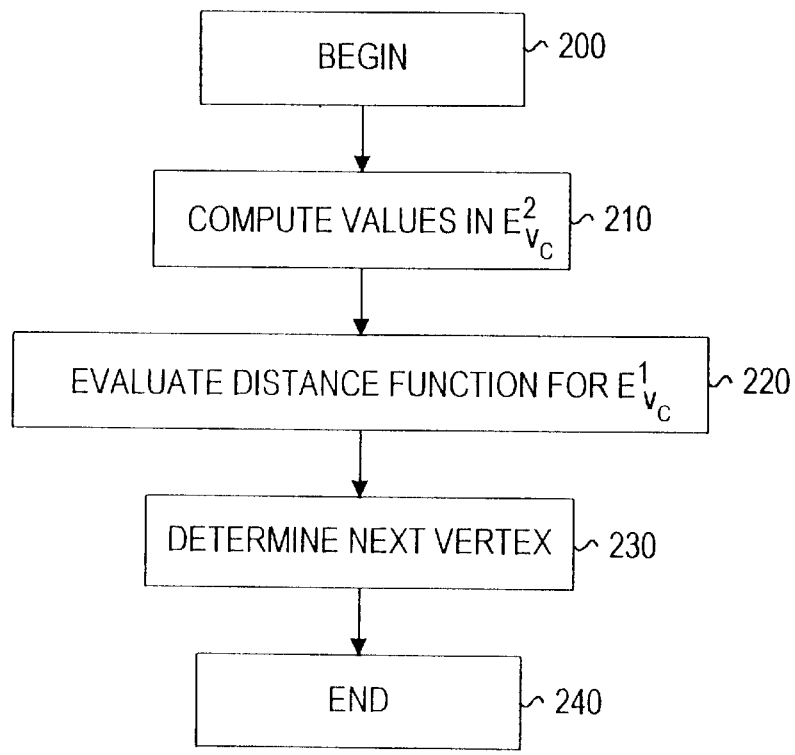
FIG. 2 is a flowchart for performing an operation in accordance with one embodiment of the present invention.

FIG. 2 illustrates a flowchart for performing a fast search through a graph in accordance with one embodiment of the present invention. In searching through a graph defined by its vertices and edges, the process described in the flowchart of FIG. 2 provides a reduction in the latency inherent in such search by pre-computing values needed in the evaluation of a distance or weight function. The distance or weight function may be used as a metric to determine which edge or branch to proceed on at each stage of the search.

As illustrated in FIG. 2, the process begins at step 200. The inputs to the distance or weight functions associated with the edges in the set $E^2_{vc}$ are computed or retrieved at step 210. As an example, the inputs may be the estimated transmitted symbols and the received symbols. At step 220, the distance or weight functions associated with the edges in the set $E^1_{vc}$ are evaluated and at step 230 the next vertex is determined based on the result of the evaluation performed at step 220. As an example, for a distance function based on the Euclidean distance between the estimated transmitted symbol and the received symbol, the next vertex will be the one along the edge which has the lowest Euclidean distance associated with it. The process ends at step 240 as illustrated in FIG. 2.

The steps as illustrated with reference to FIG. 2 may be carried iteratively, at every stage of the search procedure. Also, initialization steps may be performed prior to carrying the steps in the flowchart of FIG. 2. The initialization steps may be performed at the first stage of the search procedure. In one embodiment, the initialization may comprise the steps of computing or retrieving the values needed in the evaluation of the distance functions associated with the edges in the sets $E^1_{vc}$ and $E^2_{vc}$.

When the steps of FIG. 2 are applied for search-based decoding, the determination of which edge to follow only takes $(T_B+T_C)$ seconds, assuming $T_A<(T_B+T_C)$. The algorithm may thus proceed at a rate $(T_B+T_C)$ seconds per vertex since the result of the operation performed at step 210 is not needed for that determination. In one embodiment, step 210 is performed in parallel with steps 220 and 230 which allows for the algorithm to process a vertex at a faster rate as compared to the prior art. In the case where $T_A>(T_B+T_C)$, the algorithm proceeds at a rate $T_A$ seconds per vertex.

When performing step 210, the inputs to the distance functions associated with all the edges in the set $E^2_{vc}$ are the values needed at the next stage to evaluate the distance functions and to determine the next vertex.

Figure 3:
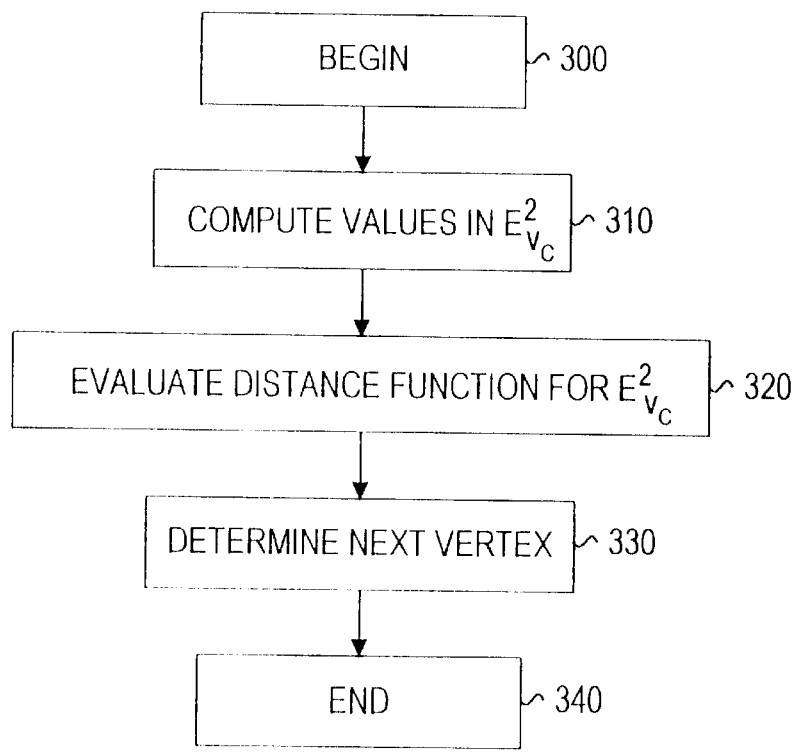
FIG. 3 is a flowchart for performing an operation in accordance with another embodiment of the present invention.

FIG. 3 is a flowchart of an algorithm that reduces the amount of time it takes for a search-based decoding algorithm to proceed from one vertex to another in accordance with another embodiment of the present invention. The flowchart begins at step 300 and at step 310, the inputs to the distance functions associated with the edges in the set $E^2_{vc}$ are computed. At step 320, the distance functions associated with those edges (in the set $E^2_{vc}$) are evaluated. In this embodiment, the only processing step that needs to be done in the determination of which edge to follow from the current vertex $V_c$ is step 320, where the next vertex is determined based on a previous evaluation of the distance functions associated with the edges in the set $E^1_{vc}$. In fact, $E^1_{vc}$ at stage k is a subset of $E^2_{vp}$ at stage (k−1) where $V_p$ is the vertex from which the edge $(V_p, V_c)$ originates, followed by the algorithm in accessing the current vertex $V_c$. The operations performed by the flowchart terminate at step 340.

The pre-evaluation of the distance functions associated with the set $E^2_{vc}$ allows the algorithm to proceed at a rate $T_C$ seconds per vertex assuming $(T_A+T_B)<T_C$ since steps 310 and 320 are performed in parallel with step 330 (if $(T_A+T_B)>T_C$ then the algorithm would proceed at $(T_A+T_B)$ seconds per vertex).

The principles of the present invention as described with reference to FIG. 2 and FIG. 3 may be applied to the Fano sequential decoding algorithm. The Fano algorithm is typically used to search a specific type of graph known as a trellis. The trellises are often used to represent error control codes or trellis codes that are used in digital communications systems. The Fano algorithm is used at the receiver to search for the minimum weight path through the trellis based on weightings that are obtained from a metric function that determines the weight on each edge as a function of received values from a communications channel and estimated received symbols.

Figure 4:
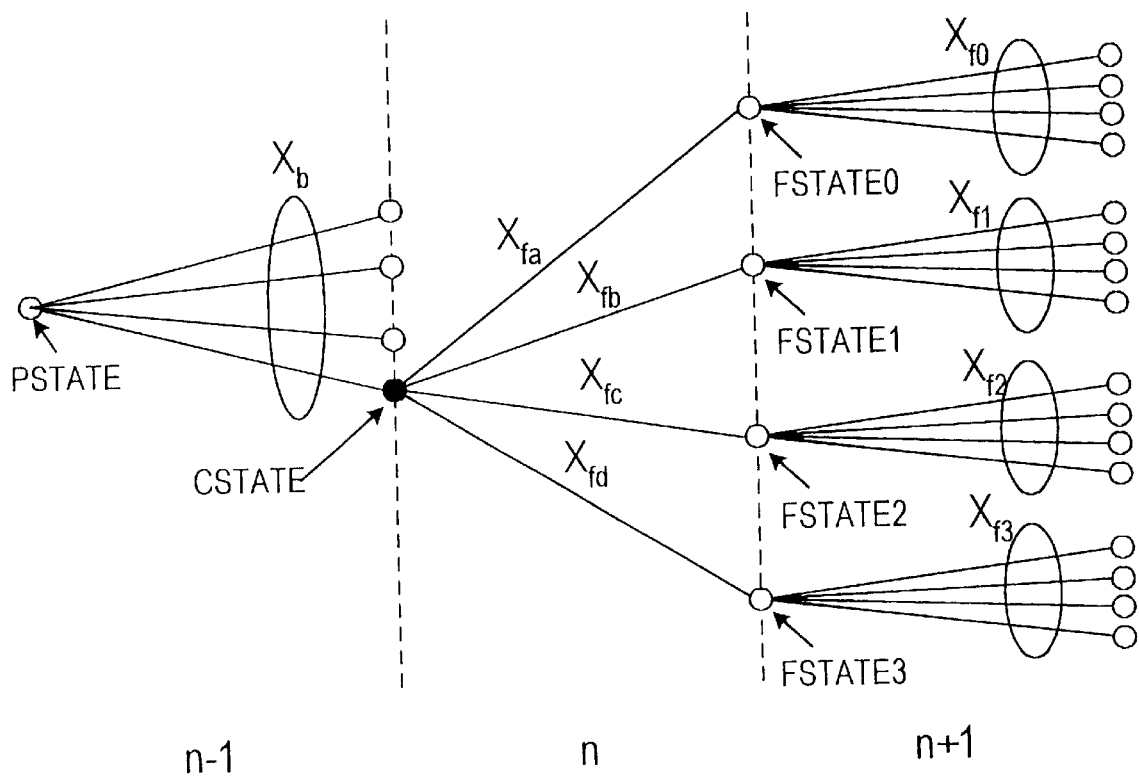
FIG. 4 is an illustration of the fast search-based decoding algorithm as applied to the Fano decoder.

FIG. 4 illustrates a portion of a trellis that may be searched by using the Fano algorithm in conjunction with the principles of the present invention.

When using the Fano algorithm, the distance metrics may be calculated as $f(\tilde{x}-\hat{x})$, where $\hat{x}$ is an estimate of the value from the channel and $\tilde{x}$ is the possibly corrupted value received from the channel. The distance function f may be computationally simple. Let $T_f$ be the time it takes to evaluate f. The decision as to which way to proceed through the trellis also takes a small amount of time, $T_d$. However, the computation of the channel estimate $\hat{x}$ takes a considerable amount of time, $T_{\hat{x}}$. The Fano algorithm uses the distance metrics associated with each branch or edge of the trellis to determine the next vertex. In the trellis representation of a finite state machine (FSM), a vertex is representative of a state of the FSM at a specific moment. The current vertex is represented, in FIG. 4, by CSTATE, the previous vertex is represented by PSTATE and the set of next vertices by FSTATE0, FSTATE1, FSTATE2 and FSTATE3 which represent the possible states that the FSM can reach from CSTATE. The stage n represents a current trellis section and contains the edges or branches labeled with $X_{fa}$, $X_{fb}$, $X_{fc}$, and $X_{fd}$. Stage (n+1) represents one forward trellis section and stage (n−1) one reverse or backward trellis section.

In one embodiment, the flowchart described in FIG. 2 is used in conjunction with the Fano algorithm to search through a trellis. According to this embodiment, the values of $\hat{x}$ for the current decision have already been calculated (from a previous computation of values in $E^2_{vp}$) and are labeled as $X_{fa}$, $X_{fb}$, $X_{fc}$, and $X_{fd}$. While f is being evaluated on these values and the decision as to which edge to follow to the next vertex is being made, the possible values of $\hat{x}$ for all edges in $E_{v_c}^2$ are also being obtained or calculated. These values include $X_{f0}$, $X_{f1}$, $X_{f2}$ and $X_{f3}$ as illustrated in FIG. 4.

In another embodiment using the method described in the flowchart of FIG. 3, the Fano algorithm may proceed at a faster rate by evaluating the distance function f associated with the edges in $E_{v_c}^2$ while determining the next state from the current state, CSTATE.

The invention may be used to calculate the channel estimates $\hat{x}$ in advance for all edges one step in the future. This means the algorithm may proceed at a rate of $T_f+T_d$ seconds for each vertex assuming that $T_{\hat{x}}<(T_f+T_d)$ (when using the method described in the flowchart of FIG. 2), or it may proceed at $T_d$ seconds for each vertex assuming that $T_d>(T_f+T_{\hat{x}})$ (when using the method described in the flowchart of FIG. 2).

Figure 5:
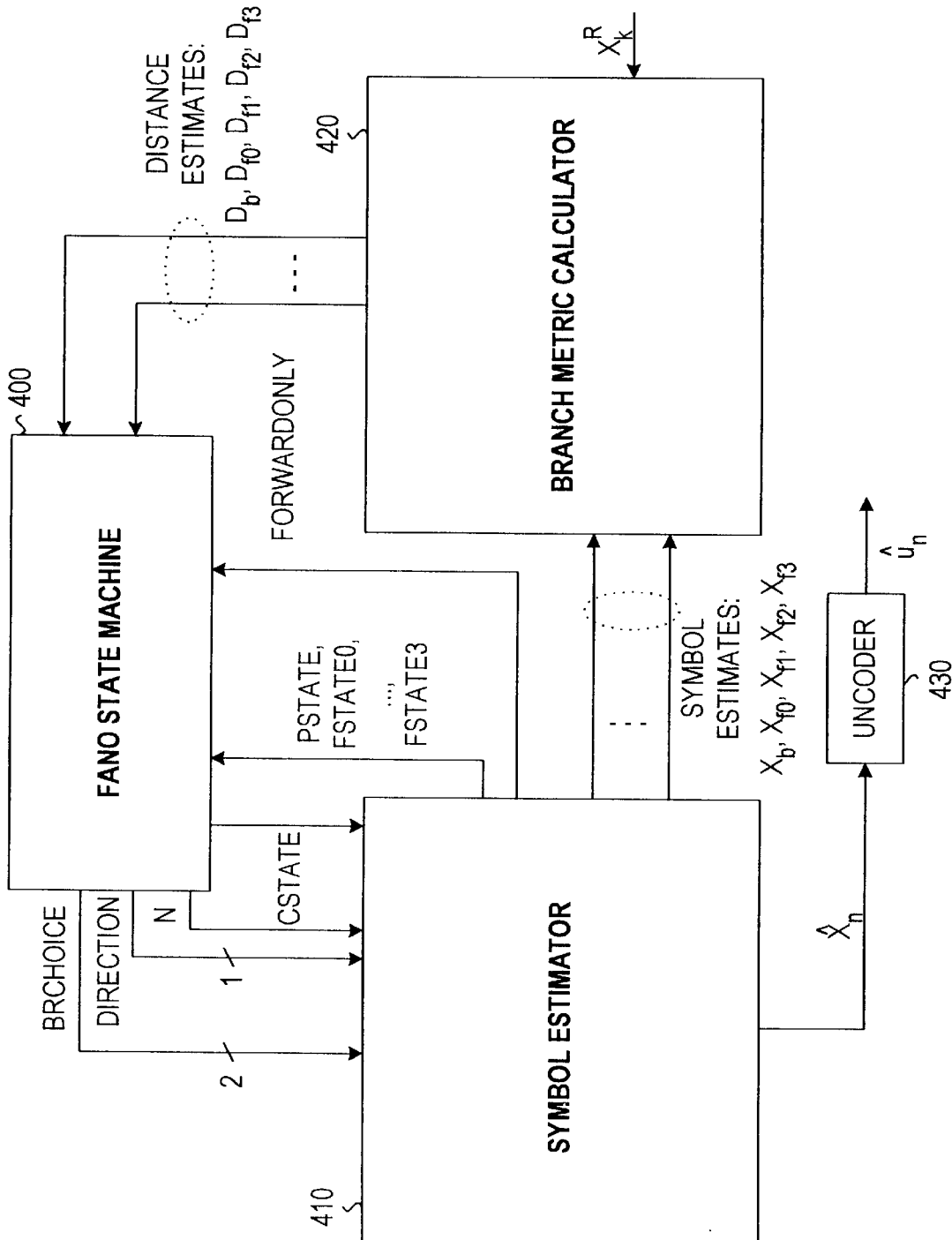
FIG. 5 is a block diagram of a Fano decoder using the principles of the present invention.

FIG. 5 shows a block diagram of a search-based decoding algorithm using the Fano algorithm for sequential decoding. As illustrated in FIG. 5, the block diagram is composed of four modules: a Fano state machine 400, a symbol estimator 410, a branch metric calculator 420 and an uncoder 430. The Fano algorithm is implemented with the fast search-based decoding scheme which pre-computes metrics on forward branches to reduce the latency inherent in such algorithm.

The symbol estimator 410 provides the branch metric calculator 420 with sets of estimates of received symbols that correspond to all possible symbols along the edges in $E_{v_c}^2$. These sets, represented herein as $X_b$, $X_{f0}$, $X_{f1}$, $X_{f2}$, $X_{f3}$, contain the estimates of the channel outputs. The branch metric calculator 420, which also has as input the received symbols $X^R_k$, computes all of the distance metrics associated with the edges in $E_{v_c}^2$.

The branch metric calculator 420 pre-calculates sets of distance metrics ($D_b$, $D_{f0}$, $D_{f1}$, $D_{f2}$, $D_{f3}$) from the sets of estimates of received symbols and the received symbols $X^r$ and then passes the metrics to the Fano state machine module (FSM) 400. The Fano state machine 400 determines on which direction to proceed (forward or backward) based on comparisons between path metrics associated with the branches in the current trellis section and a threshold. The path metrics are a function of distance metrics for edges or branches in $E^1_{v_c}$ previously calculated. The Fano state machine 400 also determines which branch the symbol estimator 410 should proceed with based on said distance metrics. The sets of metrics ($D_b$, $D_{f0}$, $D_{f1}$, $D_{f2}$, $D_{f3}$) will be used by the FSM 400 to determine which edge to follow from the next stage. The Fano state machine 400, by instructing the symbol estimator 410 to proceed on a specific direction and branch, traces a path through the trellis wherein the symbols along the path have the best match with the symbols received from the transmission channel. This match is measured by a metric, which can be based on correlation or Euclidean distance.

The uncoder 430 retrieves estimates $\hat{u}_n$ of the information bits u. In one embodiment, the estimates of the information bits are computed from estimates $\hat{X}_n$ of the trellis code symbols along the path which best matches the received symbols.

In one embodiment, the fast search-based decoding scheme can be selectively toggled on or off based on the latency of the decoding process. The Fano sequential decoding algorithm, under noisy conditions, can delay the decoding process by searching forward and backward to find the branch that has the best match with the received symbols. In this embodiment, the fast-search process is toggled on only when the decoding delay is above a threshold. The decoding delay can be measured from the number of received symbols stored in a received symbols buffer not yet processed by the decoder. A pointer corresponding to the number of symbols stored in the received symbols buffer is maintained and can be used to determine the number of symbols not yet processed. Other methods may also be used to determine the decoding delay. Use of the fast search-based decoding scheme allows reducing the latency by providing the Fano state machine 400 with distance metrics associated with the edges in $E_{v_c}^2$ while the Fano state machine 400 is processing information related to the current state.

In this embodiment, if the Fano state machine 400 determines that the decoder should step back to search a different branch (on trellis section n−1), it may then, without further calculation by the symbol estimator 410 or branch metric calculator 420, direct the symbol estimator to proceed to a specific branch determined from the pre-computed set of branch metrics. Similarly, for the forward direction, the Fano state machine 400 may instruct the symbol estimator 410 to proceed on the branch with the best match on trellis section (n+1).

The fast search-based decoding scheme provides an improvement over the prior art method for implementing the Fano sequential decoder in terms of latency and speed of operation by changing the sequential processing of information into a parallel processing to determine the next stage.

The present invention may be implemented in a number of different ways including software, hardware or a combination thereof. It can be implemented as embedded software in a Digital Signal Processor (DSP) or implemented as an Application Specific Integrated Circuit (ASIC). Other implementation methods well-known to those skilled in the art may also be used.

Although this invention has been illustrated by reference to specific embodiments, it will be apparent to those skilled in the art that various changes and modifications may be made which clearly fall within the scope of the invention. The invention is intended to be protected broadly within the spirit and scope of the appended claims.

What is claimed is:

1. A search-based method of decoding digital signals using a graph defined by a plurality of vertices and edges, the method comprising the steps of:

(a) computing input values to distance functions associated with a set of edges, wherein the edges are at a distance d at least equal to 2 from a current vertex of said graph;

(b) evaluating the distance functions associated with the edges at distance d=1 from the current vertex; and (c) determining an edge to follow from the current vertex to a next vertex, based upon said evaluated distances.

2. The method of claim 1 wherein the search-based decoding scheme is used in conjunction with the Fano algorithm.

3. A search-based method of decoding digital signals using a graph defined by a plurality of vertices and edges, the method comprising the steps of:

(a) computing input values to distance functions associated with a set of edges, wherein the edges are at a distance d at least equal to 2 from the current vertex;

(b) obtaining distance functions evaluated at a previous stage for edges at distance d=1 from a current vertex; and (c) determining an edge to follow from the current vertex to a next vertex, based upon said obtained distance functions.

4. The method of claim 3 further comprising the further step of:

(d) evaluating distance functions associated with the edges at distance d=2 from the current vertex, wherein said distance functions are used in a next stage to determine which edge to follow from said next vertex.

5. The method of claim 3 wherein the search-based decoding scheme is used in conjunction with the Fano algorithm.

6. A method for efficiently performing Fano-based decoding in a trellis defined by its states and its branches, wherein each branch has a symbol associated therewith, the method comprising the steps of:

(a) storing a sequence of received symbols, said symbols having a mapping to a section of the trellis;

(b) maintaining a progress pointer indicating a current trellis section being operated upon;

(c) pre-computing a first set of metrics for branches at a distance d at least equal to 2 from a current state;

(d) following a trellis branch based upon a comparison within a set of metrics evaluated at a previous stage, wherein the symbol associated with said trellis branch has a best match with the received symbol; and (e) incrementing the progress pointer when step (d) results in a movement to a trellis section in the forward direction.

7. The method of claim 6 further comprising the further step of:

(f) decrementing the progress pointer when step (d) results in a movement to an adjacent reverse trellis section.

8. A method for efficiently performing searches in a trellis, comprising the steps of:

(a) storing a sequence of symbols, wherein the symbols have a mapping to a section of the trellis;

(b) performing trellis decoding on the sequence of symbols;

(c) establishing a set of criteria to determine if precomputing of a set of metrics is required, wherein the set of metrics includes forward trellis section pre-calculations; and (d) pre-computing the set of metrics when the set of criteria is satisfied.

9. The method of claim 8, wherein the establishing of the set of criteria of step (c) comprises the steps of:

(i) maintaining a first pointer corresponding to the number of symbols stored;

(ii) maintaining a progress pointer indicating a current trellis section being operated upon; and (iii) determining if pre-computing of a set of metrics is required based on a difference value between the first pointer and the progress pointer.

10. The method of claim 8, wherein the establishing of the set of criteria of step (c) is determined based upon at least one movement backwards through the trellis.

11. A method for reducing latency in a search-based decoding algorithm applied over a trellis, the method comprising the steps of:

(a) pre-computing a first set of metrics corresponding to a forward trellis section relative to a current trellis section;

(b) determining from metrics corresponding to the current trellis section a movement through the trellis; and (c) following a branch corresponding to the forward trellis section when the movement through the trellis is a forward movement;

wherein the branch is identified from the first set of metrics.

12. The method of claim 11 comprising the further step of:

(d) following a branch corresponding to the backward trellis section when the movement through the trellis is a backward movement, wherein the branch is identified from a second set of metrics evaluated at a previous stage.

13. The method of claim 11 wherein the pre-computation of step (a) comprises the steps of:

(i) receiving a symbol mapped to the forward trellis section;

(ii) estimating a plurality of symbols associated with a plurality of branches of the forward trellis section; and (iii) computing metrics between said received symbol and said estimated plurality of symbols.

14. Apparatus for performing speculative computation in a search-based decoding algorithm, comprising:

(a) a pre-computation module for generating a first set of received symbol estimates corresponding to a current trellis section, and a second set of received symbol estimates corresponding to a forward trellis section relative to said current trellis section;

(b) a metrics calculation module for providing pre-calculated metrics between received symbols associated with said forward trellis section and a corresponding set of received symbol estimates; and (c) a decision module for:

determining which direction to proceed in based on metrics associated with the current trellis section, and identifying a branch in a forward trellis section to proceed on based on the pre-calculated metrics when said determination results in a forward direction.

15. The apparatus of claim 14 wherein the decision module identifies a branch in a backward trellis section to proceed on based on metrics previously calculated when the determination results in a backward direction.

* * * * *